United States Patent
Shumarayev et al.

(10) Patent No.: US 7,777,526 B2
(45) Date of Patent: Aug. 17, 2010

(54) INCREASED SENSITIVITY AND REDUCED OFFSET VARIATION IN HIGH DATA RATE HSSI RECEIVER

(75) Inventors: Sergey Shumarayev, Los Altos Hills, CA (US); Thungoc M. Tran, San Jose, CA (US); Wilson Wong, San Francisco, CA (US); Simardeep Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 61 days.

(21) Appl. No.: 12/134,777

(22) Filed: Jun. 6, 2008

(65) Prior Publication Data
US 2009/0302888 A1 Dec. 10, 2009

(51) Int. Cl.
*H03K 19/094* (2006.01)
(52) U.S. Cl. .......................................... 326/83; 326/87
(58) Field of Classification Search ............... 326/82–87
See application file for complete search history.

(56) References Cited

U.S. PATENT DOCUMENTS

| | | | |
|---|---|---|---|
| 6,509,797 B2 * | 1/2003 | Nolan | 330/255 |
| 6,650,140 B2 | 11/2003 | Lee et al. | |
| 7,239,199 B1 * | 7/2007 | Chien et al. | 330/9 |
| 7,321,259 B1 | 1/2008 | Shumarayev et al. | |
| 2003/0203725 A1 * | 10/2003 | Cowley et al. | 455/150.1 |

* cited by examiner

*Primary Examiner*—Vibol Tan
*Assistant Examiner*—Thienvu V Tran
(74) *Attorney, Agent, or Firm*—Ropes & Gray LLP; Jeffrey H. Ingerman

(57) ABSTRACT

Signal offset variation caused by transistor variation/mismatch in integrated circuits may be reduced. In one embodiment, a buffer circuit has variable-valued circuit elements. Offset variation measurements are made and the variable-valued circuit elements are calibrated to reduce the measured offset variation. In another embodiment, each amplifying stage of a multi-stage buffer provides variable gain. The total DC gain of the cascade is distributed unevenly across the stages, with more DC gain being provided by amplifier stages at the beginning of the cascade than at the end. An additional pre-amplifier stage can also be provided at the beginning of the cascade.

15 Claims, 5 Drawing Sheets

INCREASED SENSITIVITY AND REDUCED OFFSET VARIATION IN HIGH DATA RATE HSSI RECEIVER

BACKGROUND OF THE INVENTION

In general, the invention relates to integrated circuit devices. In particular, the invention relates to buffer circuits that minimize offset variation.

Generally, programmable logic devices (PLD) and other types of integrated circuits require interface circuitry such as input and output buffers for amplifying and/or conditioning signals for detection or transmission. In the case of an input buffer, the circuit receives an input signal that has typically undergone degradation and attenuation as it has propagated through a transmission link. The function of an input buffer is therefore to amplify and recondition the received signal, and in some cases to provide frequency equalization, so that the receiver circuitry can properly resolve the incoming bits. In the case of an output buffer, the circuit is typically required to drive an output signal at the appropriate levels for a given transmission link.

In either case, signal offset variation in the buffer circuitry can contribute to operational error. For example, offset variation can cause a low voltage level (i.e., a binary 0) to be read as a high voltage level (i.e., a binary 1). Furthermore, any offset variation existing in the first stage of a typical multi-stage limiting amplifier in the analog front-end of a receiver is amplified by subsequent stages. Offset variation reduces the available timing margins needed to resolve incoming data bits. This can cause an increase in the bit error rate (BER) of the receiver circuit. This problem is further exacerbated by integrated circuits shrinking in size and operating at reduced voltage margins while concurrently supporting transmission standards with increasingly higher data rates.

One technique for reducing offset-related operational error in an integrated buffer circuit is to provide programmable logic that dynamically monitors and cancels signal offset in the buffer circuit via one or more feedback loops. This technique is described in detail in U.S. Pat. No. 7,321,259, which is hereby incorporated herein by reference in its entirety. While that method works well to provide offset cancellation/reduction, feedback circuitry can be complex. In addition, more can be done during the production of integrated circuits to reduce signal offset variation even in circuits already supporting that and other methods of offset cancellation/reduction.

SUMMARY OF THE INVENTION

Accordingly, systems and methods are provided for minimizing signal offset variation in integrated circuits at the time of production. Offset variation in integrated circuits often results from imperfect or imprecise manufacturing of circuit components, and particularly transistors. For example, small differences ("mismatches") in performance between transistor pairs in differential amplifiers can lead to significant offset variation. Because manufacturing imperfections are difficult to eliminate, especially in the deep sub-micron range, it is desirable to have a technique for indirectly minimizing or eliminating offset variation caused by transistor mismatch.

Thus, in one aspect, the present invention relates to a single-stage buffer circuit with variable-valued circuit elements that are configurable to minimize offset variation caused by transistor mismatch. An exemplary buffer circuit in accordance with the principles of the present invention comprises a single-stage differential amplifier circuit having a pair of inputs, a pair of outputs, a pair of transistors, a pair of load resistors, a pair of tail current sources, a degeneration resistor, and an equalization capacitor (see FIG. 3 and detailed description further below). When there is transistor mismatch, the two outputs may differ when they should be equal. In one implementation of the invention, the load resistors are variable and used to counteract the transistor variation and bring the outputs to the correct value. At the same time, the tail current sources may be variable and used to provide a constant common mode. Offset variation in this and other exemplary buffer circuits can be measured during the production of the buffer. Based on the measurement, the variable-valued circuit elements (e.g., the load resistors and tail current sources) can be calibrated to compensate for the variation. Sometimes it may also be desirable to recalibrate the variable-valued circuit elements after production. In an exemplary scenario, offset variation is measured during some or all power-ups of the buffer circuit. In this case, the recalibration can be accomplished by the customer/user.

The above-described single-stage buffer circuit also advantageously provides variable DC gain and variable bandwidth, which are particularly important and beneficial for cascaded multi-stage buffer/amplifiers. Cascaded multi-stage buffer circuits are often used to achieve the amplification and bandwidth necessary to meet receiver sensitivity requirements, such as the PCIe Generation II requirements. However, offset variation in multistage buffers is especially detrimental because offset in one stage will be amplified by the subsequent stages. Accordingly, in another aspect, the present invention relates to a multi-stage buffer circuit comprising a cascade of amplifier stages. Each amplifier stage can be implemented using the single-stage buffer described above and can provide a variable DC gain configured to reduce the total offset variation of the multi-stage buffer circuit. In particular, the amount of DC gain provided by each amplifier stage is preferably maximal at the first stage (i.e., initial input stage) and decreases to a minimal at the last stage (i.e., final output stage) of the cascade. A DC gain pre-amplifier stage can also be provided at the beginning of the cascade.

As in the single-stage buffer circuit scenario, offset variation in multi-stage buffers in accordance with the principles of the present invention can be measured during the production of the circuit, and optionally re-measured during a later power-up. The variable-valued circuit elements of each amplifier stage in the cascade can be calibrated (or recalibrated) based on the offset variation measurements to compensate for the variation. Each amplifier stage can have a sufficient number of variable-valued circuit elements in an appropriate configuration to be able to independently minimize offset variation and provide a particular DC gain and bandwidth.

The single-stage and multi-stage buffer circuits described above can be used as an input buffer to an HSSI receiver. In such a capacity, a buffer circuit can output a pair of amplified inverse serial data signals that the HSSI receiver is configured to process. In addition to providing gain, the buffer circuit can also serve as an equalization cell (or a cascade of equalization cells) designed to decrease the transition times between level switches. Fast transition times are particularly important for receivers operating at high data rates.

BRIEF DESCRIPTION OF THE FIGURES

The above and other objects and advantages of the invention will be apparent upon consideration of the following detailed description, taken in conjunction with the accompa

DETAILED DESCRIPTION

The present invention pertains to reduction of offset variation in integrated circuits. In general, signal offsets may be categorized as DC voltage offsets or as average voltage offsets attributable to AC waveforms. For example, when integrated circuits are DC-coupled, signal offsets may be described in terms of a DC voltage offset. When the integrated circuits are AC-coupled, the signal offsets may be categorized as a voltage offset due to an averaging of the AC waveform transmitted therebetween. For example, in the case of an AC-coupled differential amplifier, the AC offset averages converge to an average common-mode offset voltage.

Variations in signal offset are in general caused by variations/mismatches in transistors and other integrated circuit components. For example, a buffer circuit may include a differential amplifier with a differential input pair of transistors. Any mismatches in the physical and electrical characteristics of the transistors forming the differential input pair can cause significant offset variation. The present invention provides various structures and techniques for reducing these types of offset variations. While the invention is described herein in the context of various differential input buffers, those skilled in the art will appreciate that the structures and techniques described herein can be applied to single-ended circuits as well as output buffers and any other circuitry that can benefit from offset variation reduction.

Figure 1:
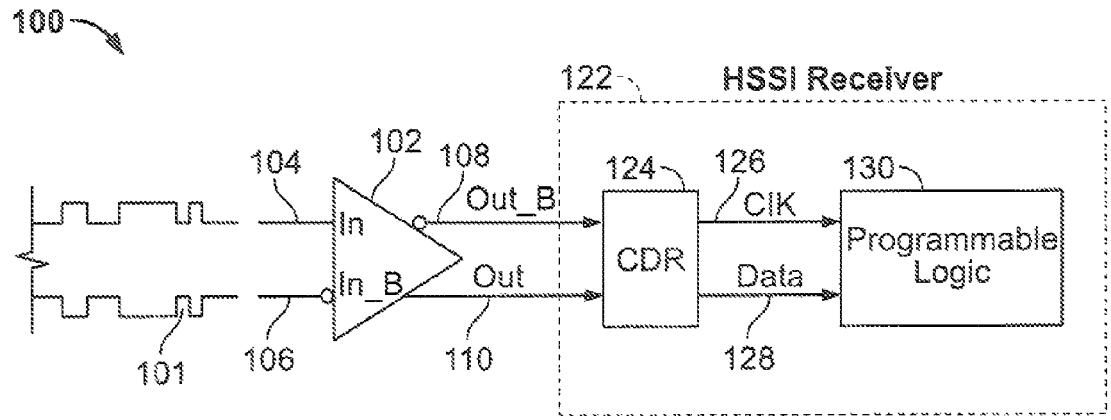
- FIG. 1 is a high level block diagram of an exemplary integrated circuit employing offset variation reduction circuitry.

Referring to FIG. 1, there is shown a high level block diagram of an exemplary integrated circuit 100 employing offset variation reduction circuitry. Circuit 100 includes a differential input buffer 102 and a receiver unit 122 that uses a high speed serial interface (HSSI). Circuits with HSSI receivers generally receive input data that is serial and unclocked. Thus, one task of an HSSI receiver is to recover the clock signal from the serial input data and provide synchronized clock and data signals to the rest of the circuitry. Furthermore, the input to an HSSI receiver is generally provided as a pair of differential signals, where one is the inverse (i.e., bit flip) of the other. An exemplary input signal pair is shown in FIG. 1 as input signals 101. Differential input buffer 102 receives input signals 101 at input 104 and input 106. Buffer 102 applies a gain to the difference between input 104 and input 106 and produces amplified signals at output 108 and output 110 that are once again inverses of each other.

While there are many ways to design buffer 102, differential buffers in general require at least one pair of transistors. Mismatch in this pair of transistors is a common source of offset variation. Transistor variation can result from inconsistencies or imperfections in the transistor manufacturing process, which will become increasingly more difficult to control as integrated circuits migrate deeper into nanoscale technologies. Techniques for designing buffer 102 to mitigate the effects of transistor variation are described further below in conjunction with FIGS. 2-4.

Returning to FIG. 1, the outputs 108 and 110 of buffer 102 are coupled to receiver 122, which employs an HSSI interface. Although the present invention is described in the context of an HSSI receiver, one skilled in the art will appreciate that techniques for reducing offset variation is applicable to other types of receivers and other types of integrated circuits in general. As mentioned previously, the input data to an HSSI receiver is generally in the form of a pair of differential signals. These signals can be provided to receiver 122 by outputs 108 and 110 of buffer 102. In one embodiment of the present invention, the data provided by outputs 108 and 110 are high speed unclocked serial data signals. In this embodiment, receiver 122 may include a clock-data recovery unit (CDR) 124 for extracting a clock signal from the unclocked serial input data. CDR 124 may be implemented in any appropriate manner to produce a clock signal 126 that is synchronized with a data signal 128. Receiver 122 may then use clock signal 126 as a trigger for sampling data signal 128 to obtain digital data values. The specific operations performed by receiver 122 may be carried out by programmable logic 130. These operations may require clock signal 126 and data signal 128.

Figure 2:
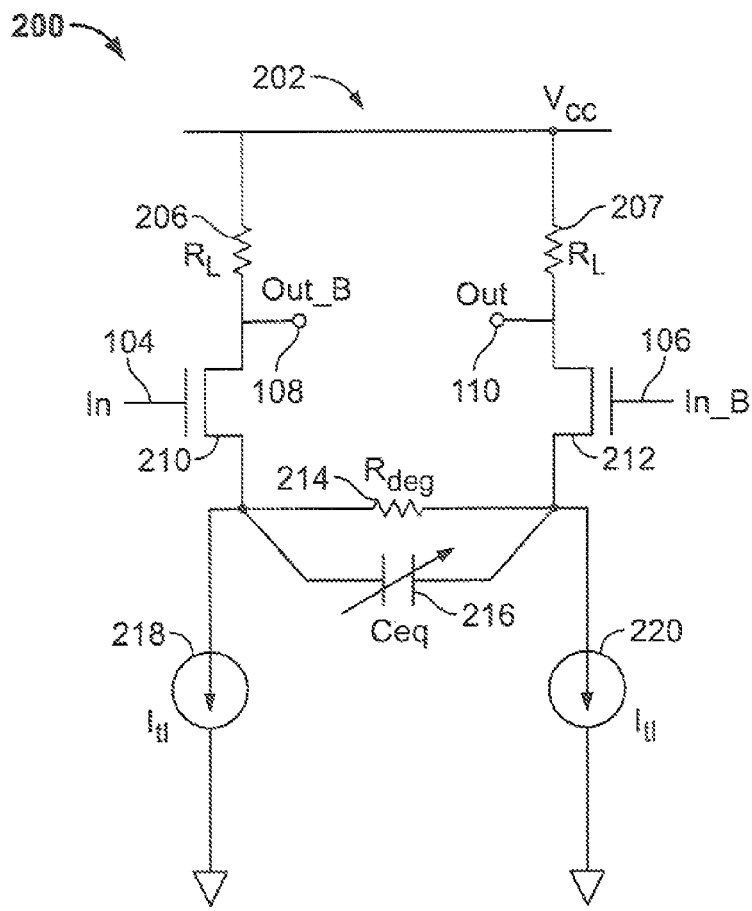
FIG. 2 is a simplified circuit diagram of an input buffer.

Referring now to FIG. 2, there is shown a simplified circuit diagram of an input buffer 200 that can be used to implement buffer 102 of FIG. 1. Buffer 200 is a differential input buffer with inputs 104 and 106, which correspond to the inputs of buffer 102. Inputs 104 and 106 are connected to the gates of a pair of transistors 210 and 212, respectively. Although transistors 210 and 212 are depicted in FIG. 2 as being N-channel MOSFETs, other types of transistors can be used instead. Connected to the drain terminals of transistors 210 and 212 are outputs 108 and 110, respectively. Also connected to the two drain terminals are load resistors 206 and 207. Load resistors 206 and 207 can have the same value $R_L$. Coupled to the other ends of load resistors 206 and 207 is receiver power source 202, which provides a constant voltage $V_{CC}$ to buffer 200. The source terminals of transistors 210 and 212 are connected to tail current sources 218 and 220, respectively. Each tail current source 218 and 220 can be implemented, for example, by an n-channel transistor whose gate is connected to a bias voltage. The source terminals of transistors 210 and 212 are bridged by degeneration resistor 214 and variable equalization capacitor 216.

Buffer 200 has a conventional source degenerated structure with DC gain defined by the ratio of $R_L$ to $2R_{deg}$. Variable equalization capacitor 216 provides buffer 200 with adjustable high frequency peaking. In some embodiments of the present invention, buffer 200 can be used as an equalization cell or as a member of a cascade of equalization cells. When buffer 200 is a member of a cascade, any offset variation in buffer 200 can be particularly detrimental because the offset variation can be amplified by subsequent stages. Offset variation can occur in buffer 200 when there exists variation/mismatch between transistors 206 and 207. For example, when zero differential voltage is applied to inputs 104 and 106, a non-zero differential voltage may be present at outputs 108 and 110.

Figure 3:
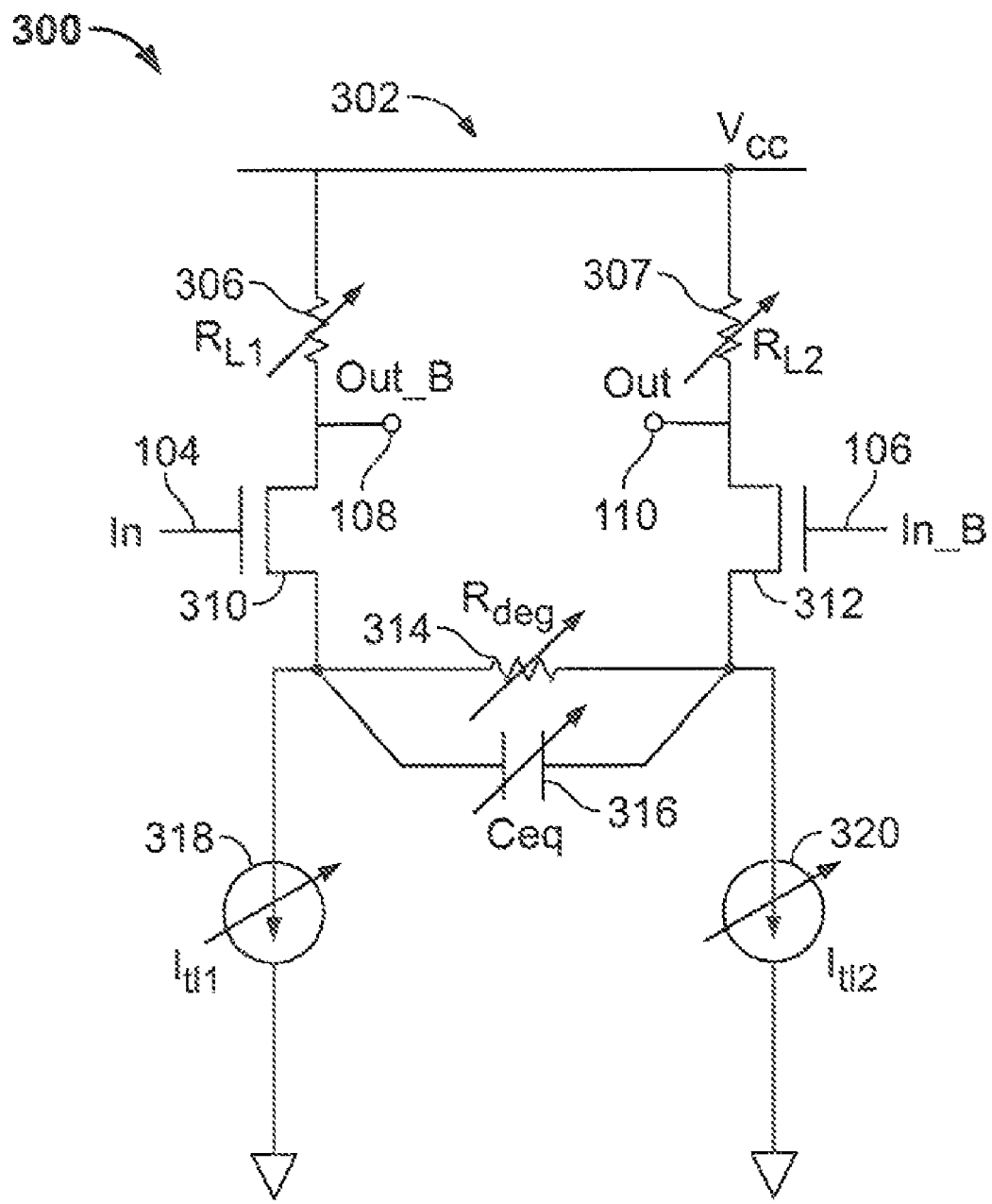
FIG. 3 is a simplified circuit diagram of an input buffer with offset variation reduction circuitry in accordance with an exemplary embodiment of the present invention.

A buffer design that can mitigate offset variation caused by transistor variation is shown in FIG. 3. The topology of buffer 300 can be similar to buffer 200, but more of the circuit elements of buffer 300 (beyond the equalization capacitor) are made to be variable-valued. For example, load resistors 306 and 307, having values $R_{L1}$ and $R_{L2}$, can be adjustable (i.e., variable-valued). Degeneration resistor 314 and equalization capacitor 316 can also be adjustable. Further still, tail current sources 318 and 320, having values $I_{t1}$ and $I_{t2}$, can be adjustable.

Although FIG. 3 shows all of the above-mentioned circuit elements as being adjustable, in some embodiments, only some of the circuit elements may be adjustable. In an exemplary embodiment, load resistors 306 and 307 have adjustable values. In this embodiment, if transistors 310 and 312 have variation such that the voltage at output 108 is greater than the voltage at output 110 when $R_{L1}$ equal $R_{L2}$ and when the voltages at inputs 104 and 106 are equal, then resistor 306 can be adjusted to a larger value so that the voltages at outputs 108 and 110 advantageously converge. Another solution to the same problem is to partially increase $R_{L1}$ while partially decreasing $R_{L2}$. Furthermore, the values of tail current sources 318 and 320 can be adjusted to provide buffer 300 with constant common mode as the values of load resistors 306 and 307 are varied.

In other embodiments, other circuit elements in buffer 300 are adjusted in a similar way to de-skew the circuit. Thus, providing buffer 300 with adjustable circuit elements during the manufacturing process compensates for transistor variations that cannot be eliminated directly. In general, it is advantageous to provide as many adjustable circuit elements as possible because each adjustable element provides an additional parameter that can be used to control the characteristics of buffer 300.

In addition to compensating for offset variation, adjustable resistors 306, 307, and 314 advantageously provide buffer 300 with variable DC gain. The DC gains at outputs 108 and 110 are defined by the ratio of $R_{L1}$ to $2R_{deg}$ and $R_{L2}$ to $2R_{deg}$, respectively. The advantages of variable DC gain are described further below in conjunction with FIG. 4. Adjustable load resistors 306 and 307 also provide buffer 300 with variable bandwidth. If outputs 108 and 110 have load capacitances $C_{L1}$ and $C_{L2}$ (not shown in FIG. 3), respectively, then the bandwidth of buffer 300 is given by the smaller of $R_{L1}C_{L1}$ and $R_{L2}C_{L2}$.

The values of the adjustable circuit elements described above can be set or reset at several instances. In one embodiment, the signal offset variation in buffer 300 is measured during production. The values of the circuit elements are then calibrated to eliminate the measured offset variation, and also to obtain the desired DC gain and bandwidth for the buffer. The values of the adjustable circuit elements may then be permanently fixed at these values. However, in another embodiment, the offset variation of buffer 300 can also be measured after production at the discretion of the user, for example, during every power-up of the device. The adjustable circuit elements can then be reset based on the most current offset variation measurement.

Figure 4:
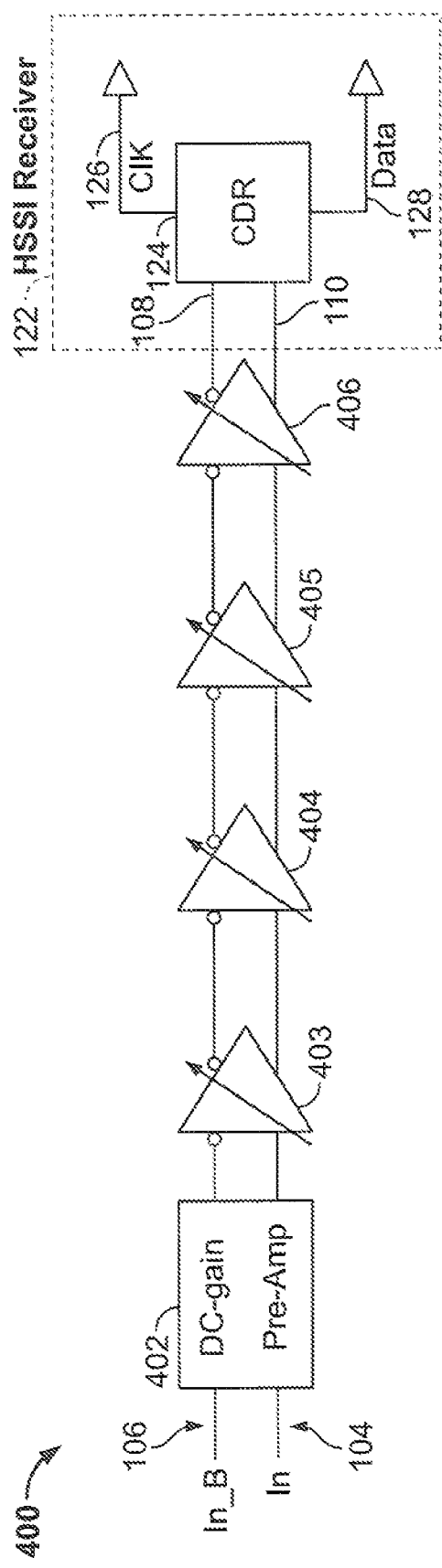
FIG. 4 is a simplified block diagram of a multi-stage input buffer in accordance with an exemplary embodiment of the present invention.

Referring now to FIG. 4, there is shown a block diagram of a multi-stage buffer 400 in accordance with an exemplary embodiment of the present invention. Buffer 400 comprises a cascade of amplifiers, where each amplifier stage 403-406 is preferably implemented by buffer 300 of FIG. 3, although using another amplifying circuit would not depart from the scope of the invention. Buffer 400 can comprise any number of amplifier stages and can optionally include pre-amplifier 402. Pre-amplifier 402 can provide buffer 400 with an additional increment of DC gain.

An advantage of buffer 400 over single-stage buffers is that buffer 400 can provide more gain to inputs 108 and 110. Each stage 403-406 can usually provide 3 dB to 6 dB of gain, depending on the specific architecture of the stage. Thus, with four cascaded stages, buffer 400 can provide at least 12 dB to 24 dB of gain. High gain amplification of input signals is particularly advantageous and sometimes necessary for meeting input/output sensitivity requirements for integrated circuits, such as the sensitivity requirements of the PCIe Generation II standard.

In addition, because each amplifier stage 403-406 can provide variable DC gain if implemented with buffer 300, buffer 400 can advantageously distribute gain unevenly across stages 403-406 to reduce offset variation. In general, offset variation reduction is more effective in a multi-stage buffer if more gain is introduced in the earlier stages of the cascade, because any offset variation remaining in a stage will be amplified by the gains of all the subsequent stages. This is also one reason for positioning pre-amplifier 402 before stages 403-406.

Figure 5:
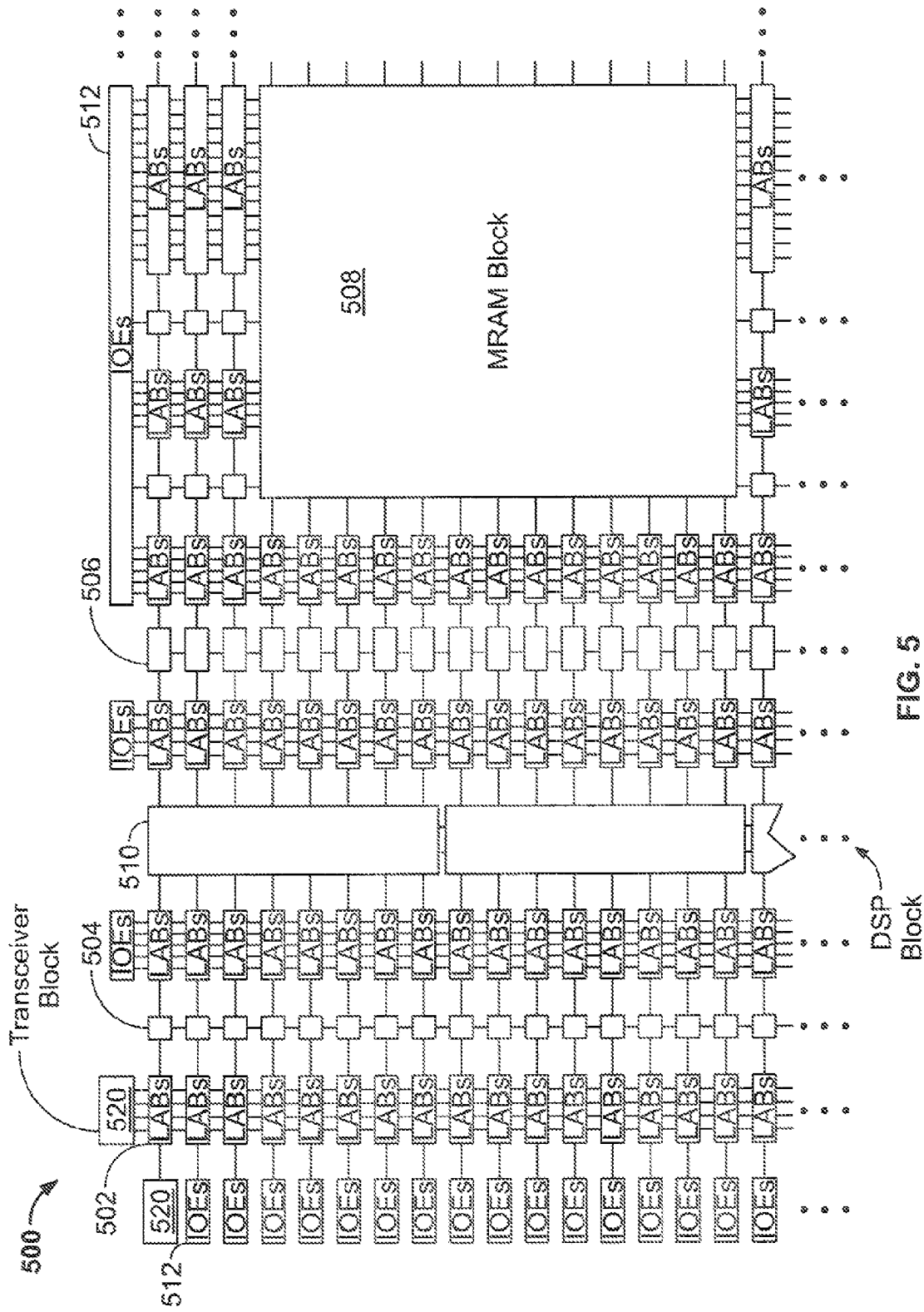
FIG. 5 is a simplified block diagram of a PLD that can be included in the integrated circuit shown in FIG. 1.

Continuing on to FIG. 5, there is shown an exemplary PLD 500 that can be used to carry out operations in receiver 122 of FIG. 1. For example, PLD 500 may be programmable logic 130 of FIG. 1. It should be understood, however, that the present invention can be applied to numerous other types of integrated circuits including programmable logic integrated circuits, field programmable gate arrays, mask FPGAs, and application specific integrated circuits (ASICs) or application specific standard products (ASSPs) that provide programmable resources.

In FIG. 5, PLD 500 includes a two dimensional array of programmable logic array blocks (LABs) 502 that are interconnected by a network of column and row interconnects of varying length and speed. LABs 502 can include multiple (e.g., ten) logic elements (LEs). An LE is a programmable logic block that provides for efficient implementation of user defined logic functions. A PLD has numerous logic elements that can be configured to implement various combinatorial and sequential functions. The logic elements can have access to a programmable interconnect structure. The programmable interconnect structure can be programmed to interconnect the logic elements in almost any desired configuration.

PLD 500 can also include a distributed memory structure, including RAM blocks of varying sizes provided throughout the array. The RAM blocks can include, for example, 512 bit blocks 504, 4K blocks 506, and a block 508 providing 512K bits of RAM. These memory blocks can also include shift registers and FIFO buffers.

In some embodiments, PLD 500 can further include digital signal processing (DSP) blocks 510 that can implement, for example, multipliers with add or subtract features. I/O elements (IOEs) 512 located, in this example, around the periphery of the device support numerous single-ended and differential I/O standards. These I/O elements 512 may include differential input or output buffers with offset cancellation circuitry of the type shown in FIGS. 1-4.

PLD 500 can additionally provide transceiver functionality for telecommunication applications. In the exemplary embodiment shown in FIG. 5, PLD 500 includes one or more transceiver blocks 520. Any one or more of transceiver blocks 520 may include receiver block 122 of FIG. 1 and may implement offset reduction techniques as described herein. It should be understood that PLD 500 is described herein for illustrative purposes only and that the present invention can be implemented in many different types of PLDs, FPGAs, and the like.

Figure 6:
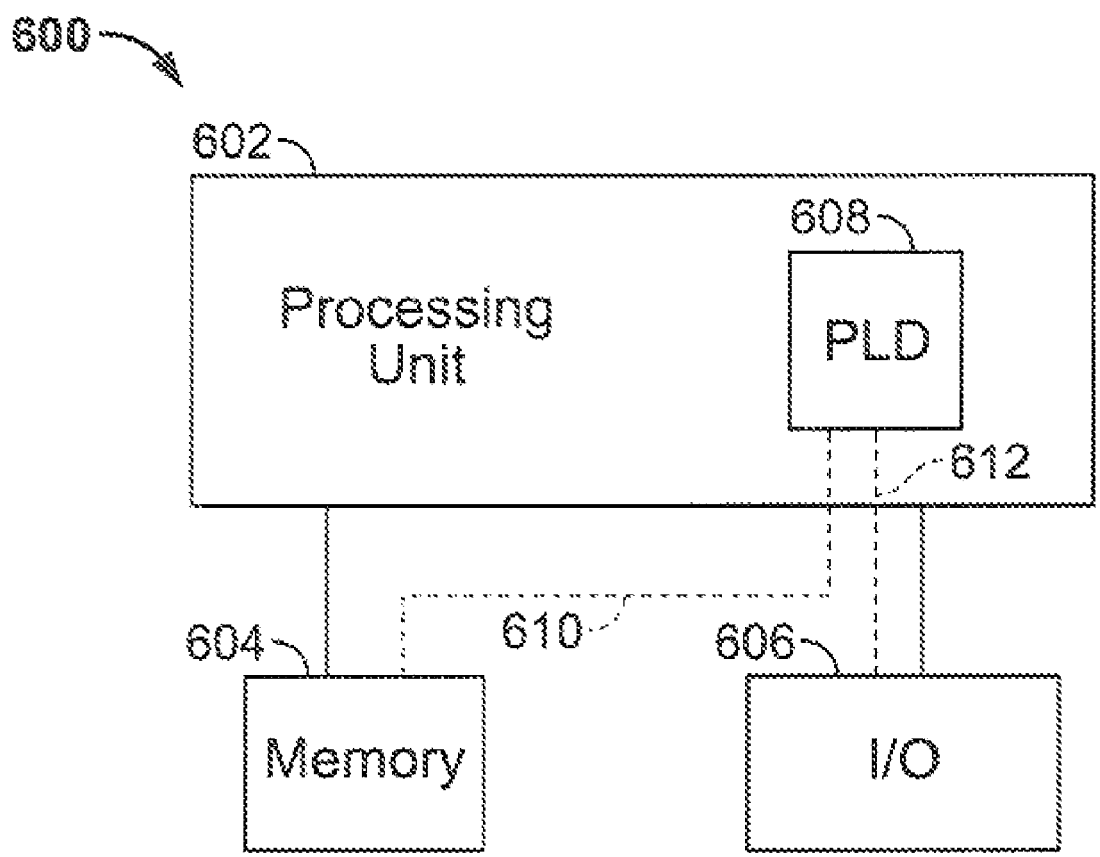
FIG. 6 is a simplified block diagram of an electronic system in which the present invention can be embodied.

Moving on to FIG. 6, there is shown a block diagram of an exemplary digital system 600, within which the present invention can be embodied. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, internet communications and networking, and others. Furthermore, system 600 can be provided on a single board, on multiple boards, or within multiple enclosures.

System 600 can include a processing unit 602, a memory unit 604 and an I/O unit 606 interconnected together by one or more buses. In this exemplary embodiment, a PLD 608 is embedded in processing unit 602. PLD 608 can serve many different purposes within the system in FIG. 6. PLD 608 can, for example, be a logical building block of processing unit 602, supporting its internal and external operations. PLD 608 can be programmed to implement the logical functions necessary to carry on its particular role in system operation. PLD 608 can be specially coupled to memory 604 through connection 610 and to I/O unit 606 through connection 612. Processing unit 602 can direct data to an appropriate system component for processing or storage, execute a program stored in memory 604 or receive and transmit data via I/O unit 606, or another similar function. Processing unit 602 can be a central processing unit (CPU), microprocessor, floating point coprocessor, graphics coprocessor, hardware controller, microcontroller, programmable logic device programmed for use as a controller, network controller, and the like.

Furthermore, in some embodiments, there is no need for a CPU. For example, instead of a CPU, one or more PLDs 608 can control the logical operations of the system. In an embodiment, PLD 608 acts as a reconfigurable processor, which can be reprogrammed as needed to handle a particular computing task. Alternatively, programmable logic device 608 can itself include an embedded microprocessor. Memory unit 604 can be a random access memory (RAM), read only memory (ROM), fixed or flexible disk media, PC card, flash disk memory, tape, or any other storage means, or any combination of these storage means. The present invention thus provides various techniques for offset reduction that is enabled by programmable logic.

While the above provides a detailed description of various embodiments of the invention, many alternatives, modifications, and equivalents are possible. In particular, the present invention may be combined with other techniques, such as the dynamic offset cancellation techniques described in U.S. Pat. No. 7,321,259, to optimally reduce offset variation and increase sensitivity. Therefore, the scope of this invention should not be limited by the specific embodiments described above, and should instead be determined with reference to the appended claims along with their full scope of equivalents.

What is claimed is:

1. A single-stage buffer circuit comprising:
   a first differential input transistor and a second differential input transistor, each transistor having a respective gate, source, and drain;
   a first input connected to the gate of the first differential input transistor;
   a second input connected to the gate of the second differential input transistor;
   a first output connected to the drain of the first differential input transistor;
   a second output connected to the drain of the second differential input transistor;
   a first load resistor connected between the drain of the first differential input transistor and a power supply;
   a second load resistor connected between the drain of the second differential input transistor and the power supply;
   a first tail current source connected between the source of the first differential input transistor and ground;
   a second tail current source connected between the source of the second differential input transistor and ground;
   a degeneration resistor connected between the source of the first differential input transistor and the source of the second differential input transistor; and
   an equalization capacitor connected between the source of the first differential input transistor and the source of the second differential input transistor; wherein:
   at least one of said first and second tail current sources, said degeneration resistor and said first and second load resistors is a variable-valued circuit element.

2. The buffer circuit of claim 1 wherein the at least one variable-valued circuit element further provides the buffer circuit with variable bandwidth.

3. The buffer circuit of claim 1 wherein the buffer circuit is connected as an input buffer to a high speed serial interface (HSSI) receiver.

4. The buffer circuit of claim 3 wherein the buffer circuit is an equalization cell.

5. The buffer circuit of claim 3 wherein the buffer circuit provides a pair of differential serial data signals to the HSSI receiver.

6. A single-stage buffer circuit comprising:
   a first differential input transistor and a second differential input transistor, each transistor having a respective gate, source, and drain;
   a first input connected to the gate of the first differential input transistor;
   a second input connected to the gate of the second differential input transistor;
   a first output connected to the drain of the first differential input transistor;
   a second output connected to the drain of the second differential input transistor;
   a first load resistor connected between the drain of the first differential input transistor and a power supply;
   a second load resistor connected between the drain of the second differential input transistor and the power supply;
   a first tail current source connected between the source of the first differential input transistor and ground;
   a second tail current source connected between the source of the second differential input transistor and ground; and
   a degeneration resistor connected between the source of the first differential input transistor and the source of the second differential input transistor; wherein:
   the first differential input transistor and the second differential input transistor have a transistor mismatch offset variation; and
   the at least one variable-valued circuit element is calibrated to minimize the offset variation.

7. The buffer circuit of claim 6 wherein the at least one variable-valued circuit element further provides the buffer circuit with variable bandwidth.

8. The buffer circuit of claim 6 wherein the buffer circuit is connected as an input buffer to a high speed serial interface (HSSI) receiver.

9. The buffer circuit of claim 8 wherein the buffer circuit is an equalization cell.

10. The buffer circuit of claim 8 wherein the buffer circuit provides a pair of differential serial data signals to the HSSI receiver.

11. A single-stage buffer circuit comprising:
    a first differential input transistor and a second differential input transistor, each transistor having a respective gate, source, and drain;

a first input connected to the gate of the first differential input transistor;

a second input connected to the gate of the second differential input transistor;

a first output connected to the drain of the first differential input transistor;

a second output connected to the drain of the second differential input transistor;

a first load resistor connected between the drain of the first differential input transistor and a power supply;

a second load resistor connected between the drain of the second differential input transistor and the power supply;

a first tail current source connected between the source of the first differential input transistor and ground;

a second tail current source connected between the source of the second differential input transistor and ground; and a degeneration resistor connected between the source of the first differential input transistor and the source of the second differential input transistor; wherein:

the first tail current source and the second tail current source are calibrated to provide constant common mode.

12. The buffer circuit of claim 11 wherein the at least one variable-valued circuit element further provides the buffer circuit with variable bandwidth.

13. The buffer circuit of claim 11 wherein the buffer circuit is connected as an input buffer to a high speed serial interface (HSSI) receiver.

14. The buffer circuit of claim 13 wherein the buffer circuit is an equalization cell.

15. The buffer circuit of claim 13 wherein the buffer circuit provides a pair of differential serial data signals to the HSSI receiver.

* * * * *